United States Patent [19]

Dixon et al.

[11] 4,340,967
[45] Jul. 20, 1982

[54] SEMICONDUCTOR LASERS WITH STABLE HIGHER-ORDER MODES PARALLEL TO THE JUNCTION PLANE

[75] Inventors: Richard W. Dixon, Bernardsville; Bertram Schwartz, Westfield, both of N.J.

[73] Assignee: Bell Telephone Laboratories, Incorporated, Murray Hill, N.J.

[21] Appl. No.: 155,560

[22] Filed: Jun. 2, 1980

[51] Int. Cl.³ .............................................. H01S 3/19
[52] U.S. Cl. ........................................ 372/46; 357/17
[58] Field of Search .................... 331/94.5 H; 357/17, 357/18

[56] References Cited

U.S. PATENT DOCUMENTS

| | | | |
|---|---|---|---|
| 3,701,044 | 10/1972 | Paoli et al. | 331/94.5 H |
| 3,733,561 | 5/1973 | Hayashi | 331/94.5 H |
| 3,824,133 | 7/1974 | D'Asaro et al. | 148/1.5 |
| 3,838,359 | 9/1974 | Hakki et al. | 331/94.5 H |
| 3,883,821 | 5/1975 | Miller et al. | 331/94.5 H |
| 4,122,410 | 10/1978 | Kressel et al. | 331/94.5 H |

OTHER PUBLICATIONS

Yonezu et al, "New Stripe Geometry Laser with High Quality Lasing Characteristics by Horizontal Transverse Mode Stabilization—A Refractive Index Guiding with Zn Doping", Japan. J. Appl. Phys. vol. 16, (1977) No. 1, pp. 209–210.

*Primary Examiner*—James W. Davie
*Attorney, Agent, or Firm*—Michael J. Urbano

[57] ABSTRACT

This invention is a semiconductor junction laser which operates in a transverse mode, other than the fundamental mode, parallel to the p-n junction. An undesired transverse mode parallel to the p-n junction may be suppressed by introducing a lossy region within the laser where this mode has at least one of its maxima. The zero order transverse mode parallel to the p-n junction may be suppressed in a double heterostructure stripe geometry laser by introducing an optically or electrically lossy region in the current flow path of the laser where the zero order mode has its maximum. This double heterostructure stripe geometry laser operates linearly with respect to current in the first order transverse mode parallel to the p-n junction.

11 Claims, 13 Drawing Figures

SEMICONDUCTOR LASERS WITH STABLE HIGHER-ORDER MODES PARALLEL TO THE JUNCTION PLANE

TECHNICAL FIELD

This invention pertains to the field of semiconductor junction lasers and more particularly to semiconductor lasers which operate stably in a transverse mode, higher than zero order, parallel to the p-n junction.

BACKGROUND OF THE INVENTION

In a double heterostructure junction laser, the output radiation includes transverse modes which oscillate both parallel and perpendicular to the p-n junction plane. Numerous schemes have been suggested for producing fundamental transverse mode operation in the direction perpendicular to the junction plane; e.g. Hayashi, U.S. Pat. No. 3,733,561 issued May 15, 1973 and Hakki et al, U.S. Pat. No. 3,838,359 issued Sept. 24, 1974. Various schemes have also been suggested to produce fundamental transverse mode operation parallel to the junction plane e.g., Miller, U.S. Pat. No. 3,883,821 issued May 13, 1975 and Kressel, U.S. Pat. No. 4,122,410, issued Oct. 24, 1978.

It has been established that stabilization of the lateral position of the lasing mode parallel to the p-n junction results in improved linearity of light output as a function of current. This property is quite useful because "kinks" in the light output versus current relationship are undesirable in applications involving modulation of laser intensity.

Dixon et al, *Applied Physics Letters, Vol.* 20, page 372 (1976) have stabilized the lateral position of the lasing mode parallel to the p-n junction in a stripe geometry double heterostructure $Al_xGa_{1-x}As$ laser by narrowing from 12 $\mu$m to 8 $\mu$m the width of the stripe geometry active region. Control of the lateral position of the transverse mode parallel to the p-n junction has also been accomplished by utilizing built in refractive index changes along the junction plane. See Aiki et al, *Applied Physics Letters*, 30, 649 (1977) and Yonezu et al, *Japanese Journal of Applied Physics* 16, 209 (1977). All of the schemes so far reported attempt to produce and stabilize a symmetric zero order transverse mode parallel to the p-n junction plane. These structures still possess optical nonlinearities to some extent, although at increased light output. These nonlinearities are related to mode distortions which cause deviations from the symmetric zero order mode parallel to the junction plane. Some of these distortions are due to a mixing or competition between the zero order symmetric mode and the first order antisymmetric mode.

SUMMARY OF THE INVENTION

This invention is a semiconductor junction laser which operates in a transverse mode, other than the fundamental mode, parallel to the p-n junction. An undesired transverse mode parallel to the p-n junction is suppressed by introducing a lossy region within the laser where this mode has at least one of its maxima. Modes not having a maximum within the lossy region are substantially unaffected by the lossy region and, therefore, these modes dominate operation of the laser.

Illustratively the present invention includes a semiconductor body having at least two contiguous layers forming a p-n junction and means forming a current flow path overlapping at least a portion of the p-n junction. An active region within the current flow path is capable of generating stimulated radiation in a direction parallel to a central axis when the p-n junction is forward biased. One or more elongated lossy regions, of a kind effective to suppress undesired transverse modes in a direction parallel to the p-n junction, extend parallel to the central axis and are located within the current flow path. For example, a lossy region centered about a plane including the central axis and perpendicular to the p-n junction, is effective to suppress the zero order transverse mode parallel to the p-n junction.

The current flow path is that part of the semiconductor body comprising the laser through which the useful current flows. For example, in broad area contact devices, the current flow path may include the entire semiconductor body. In some embodiments of a stripe geometry device, a portion of the current flow path is formed by a relatively narrow current flow channel which may or may not overlap the p-n junction. In other stripe geometry devices, the entire current flow path is formed by a relatively narrow current flow channel which overlaps the p-n junction.

One illustrative embodiment of this invention is a double heterostructure semiconductor laser comprising an n-type substrate, a wide bandgap n-type cladding layer, a narrow bandgap p-type active layer forming a p-n junction with the n-type cladding layer, and a wide bandgap p-type cladding layer. A $p^+$ cladding layer may be added to facilitate the making of electrical contacts. A pair of spaced parallel cleavage surfaces perpendicular to the plane of the layers form an optical resonator. Two spaced proton bombarded zones, extending between the cleavage surfaces and from the top of the $p^+$ capping layer into the n-type wide bandgap cladding layer, form a current flow channel which is a relatively narrow portion of the current flow path of the device. The stripe geometry active region of the laser comprises the portion of the narrow bandgap p-type layer located between the proton bombarded electrically insulating zones. When the p-n junction is forward biased, stimulated radiation is generated parallel to the laser stripe. An elongated lossy region located within the channel and centered halfway between the proton bombarded zones is included to suppress the zero order transverse mode parallel to the junction. The zero order mode has a maximum at the middle of the stripe and is suppressed by the lossy region. The first order antisymmetric mode has a minimum along the central axis of the stripe and is substantially unaffected by the lossy region.

The light output of this laser is highly linear with respect to current. Nonlinear behavior which results from a mixing of the zero order symmetric mode and the antisymmetric first order mode parallel to the p-n junction plane is mitigated by suppressing the zero order mode.

Since the first order mode has two lobes, the output of this laser may be useful for applications where two beams of precisely related amplitude and phase are desired.

BRIEF DESCRIPTION OF THE DRAWING

For the purposes of clarity, the figures have not been drawn to scale.

DETAILED DESCRIPTION

The invention comprises a semiconductor junction laser which operates in a higher order transverse mode parallel to the p-n junction plane.

Figure 1:
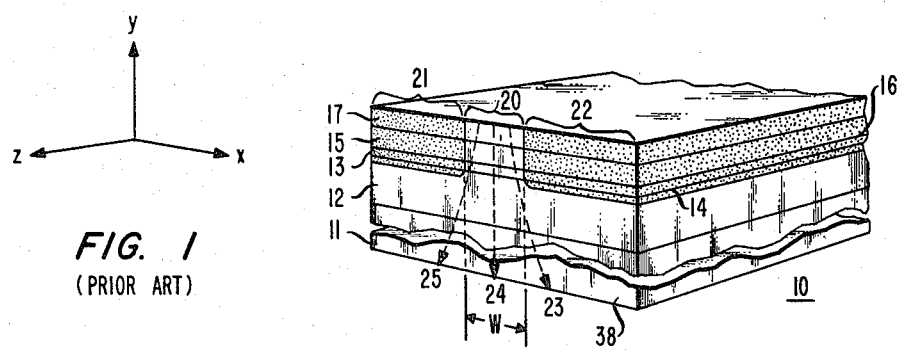
FIG. 1 illustrates a double heterostructure stripe geometry laser of the type found in the prior art in which the zero order mode is stabilized parallel to the p-n junction plane.

Before describing the invention, however, it will be useful to briefly consider first a prior art laser which operates stably in the zero order transverse mode parallel to the p-n junction (see Dixon et al, supra). A double heterostructure p-n junction laser of this type, is shown in FIG. 1. The laser 10 illustratively comprises an n-type GaAs substrate 11 upon which are grown the following contiguous epitaxial layers:

a wide bandgap n-type $Al_xGa_{1-x}As$ cladding layer 12 about 2 $\mu$m thick;

a narrower bandgap p-type GaAs active layer 13 about 0.1–0.5 $\mu$m thick forming a planar p-n heterojunction 14 with the n-type layer 12;

a wide bandgap p-type $Al_xGa_{1-x}As$ cladding layer 15 about 1 $\mu$m thick forming a planar p-p heterojunction 16 with the p-type GaAs layer 13; and a $p^+$-type GaAs capping layer 17 to facilitate contacting.

A current flow channel 20 of width W is delineated by proton bombardment of separated zones 21 and 22 (see L. A. D'Asaro et al, U.S. Pat. No. 3,824,133). For linear laser operation in the zero order transverse mode parallel to p-n junction 14, W is about 5–8 $\mu$m. In the laser of FIG. 1, proton bombarded zones 21 and 22 penetrate active layer 13. In other embodiments of the stripe geometry laser, shallow proton bombarded zones which do not penetrate the active layer are used to form the current flow channel. The current flow channel 20 of FIG. 1 forms a portion of the current flow path of the laser shown in FIG. 1. The current flow path is symbolically indicated by arrows 23, 24, and 25 of FIG. 1.

Forward biasing p-n junction 14 of FIG. 1 results in current flow in the channel, thereby defining the stripe geometry active region as the portion of layer 13 bounded by regions 21 and 22. Minority carrier injection into the active region from wide bandgap n-type layer 12 followed by carrier recombination leads to stimulated emission in the Z direction. The stimulated radiation is generated between cleavage surface 38 and a parallel cleavage surface not shown in FIG. 1 which together form an optical resonator.

Figure 2:
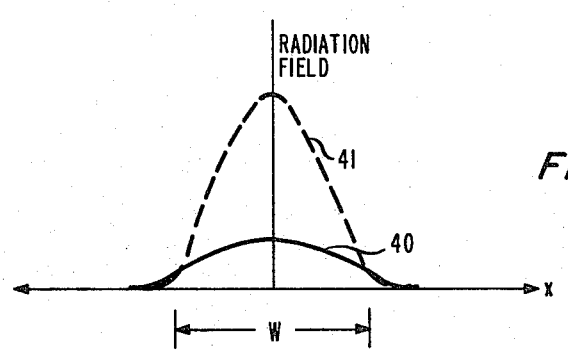
FIG. 2 exhibits the far field radiation pattern of the laser shown in FIG. 1.

The far field radiation pattern of laser 10 is shown in FIG. 2. The abscissa in FIG. 2 represents distance along the X axis of FIG. 1. The ordinate of the graph shown in FIG. 2 is the radiation field of the laser exhibited in FIG. 1. Solid curve 40 is the electric field amplitude and dashed curve 41 is the intensity of the symmetric zero order mode. The intensity is proportional to the square of the electric field.

At low injection currents, the light output of the laser of FIG. 1 is linear with respect to current. At higher injection currents, nonlinear distortions, resulting from a mixing of the zero and first order transverse modes, may be present.

The present invention is a semiconductor junction laser in which specific undesired transverse modes parallel to the p-n junction are suppressed by including lossy regions within the laser. The lossy regions extend longitudinally along the laser in a direction parallel to the direction of stimulated emission and are located in the current flow path of the semiconductor body comprising the laser. In order to effectively suppress a particular mode, a lossy region should essentially coincide with at least one maximum of that mode. Those modes not having a maximum coincident with the lossy regions are substantially less affected by the lossy regions. The lossy regions may be optically lossy regions in which case the carrier concentration profile at the p-n junction is unaltered. An optically lossy region should be close enough to the active region of the laser to be effective in suppressing the desired mode. The lossy regions may also be electrically lossy regions. This type of lossy region, which should overlap a portion of the active region of the laser, suppresses a particular mode by reducing the carrier concentration at one or more maxima of the mode. In addition, some lossy regions may be both optically and electrically lossy. The general principles of this invention are illustrated in FIGS. 3–11.

Figure 3:
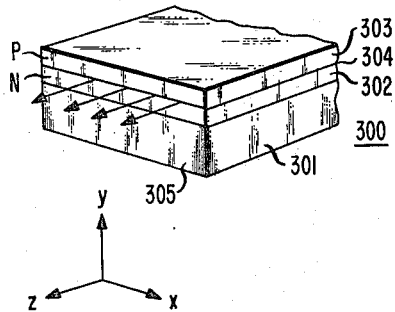
FIG. 3 shows a schematic of a p-n junction laser having no lossy regions.
Figure 4:
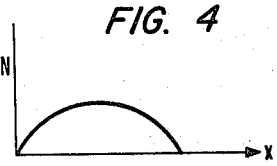
FIG. 4 shows the carrier concentration profile of the laser of FIG. 3.
Figure 5:
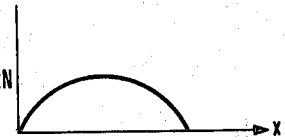
FIG. 5 shows the far field pattern of the laser of FIG. 3.

FIG. 3 shows a schematic of a simple two layer p-n junction laser 300 having no lossy regions. The concepts developed using this simple laser are extendable in a straight forward manner to more complex lasers such as double heterostructure devices. The laser of FIG. 3 comprises semiconductor substrate 301, n-type laser 302 and p-type layer 303. Cleavage surface 305 and a parallel cleavage surface not shown form an optical resonator. Upon forward biasing p-n junction 304, minority carrier injection and recombination lead to the generation of stimulated emission, within an active region including p-n junction 304, in the directon of the arrows in FIG. 3 (Z direction). FIG. 4 shows the carrier concentration (electrons and holes) in the X direction. The far field pattern of the dominant zero order transverse mode parallel to the p-n junction is shown in FIG. 5. Since the laser of FIG. 3 is a broad area device, other transverse modes of higher order are present if the injection current is high enough above threshold. The higher order modes will result in nonlinear distortions of the far field pattern.

Figure 6:
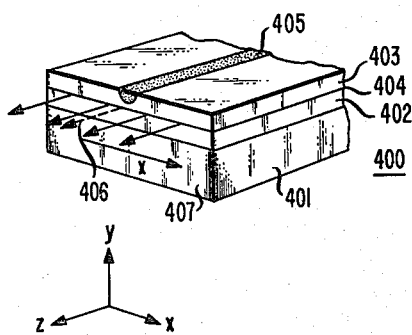
FIG. 6 shows a schematic of a p-n junction laser in which the zero order transverse mode is suppressed by an optically lossy region, in accordance with an illustrative embodiment of the invention.

The zero order mode may be suppressed in various ways in accordance with the principles of this invention. FIG. 6 shows the schematic of the p-n junction laser shown in FIG. 3 with the addition of an optically lossy region close enough to the active region of the laser to be effective in suppressing the zero order transverse mode parallel to the p-n junction. Laser 400 comprises semiconductor substrate 401, n-type layer 402 and p-type layer 403. The optical resonator includes cleavage surface 407 and a parallel cleavage surface not shown. In order to be effective in suppressing preferentially the zero order mode, the optically lossy region 405 should be essentially coincident with the maximum of that mode. Thus, the optically lossy region 405 should be approximately centered about a plane including central axis 406 and perpendicular to the plane of the p-n junction.

Figure 7:
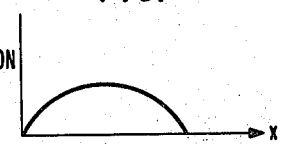
FIG. 7 shows the carrier concentration profile of the laser of FIG. 6.
Figure 8:
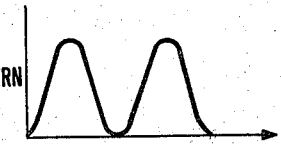
FIG. 8 shows the far field pattern of the laser of FIG. 6.

The optically lossy region 405 of FIG. 6 has no effect on the carrier concentration as shown in FIG. 7. The first order mode shown in FIG. 8 dominates the device because it is the lowest mode unaffected by the lossy region. However, the laser of FIG. 6 is a broad area device and other modes may be present, thereby causing nonlinear distortions in the output.

Figure 9:
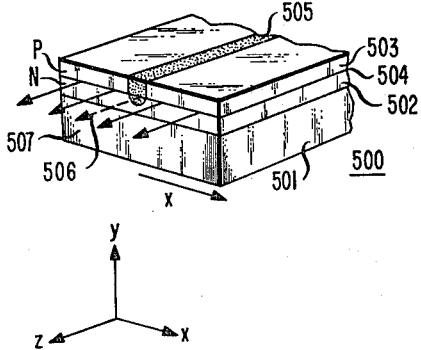
FIG. 9 shows a schematic of a p-n junction laser in which the zero order mode is suppressed by an electrically lossy region, in accordance with an illustrative embodiment of the invention.
Figure 10:
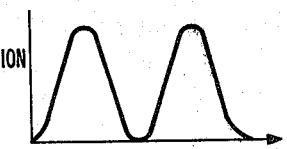
FIG. 10 shows the carrier concentration profile of the laser of FIG. 9.
Figure 11:
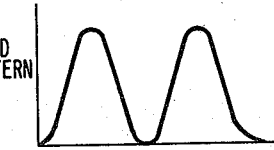
FIG. 11 shows the far field pattern of the laser of FIG. 9.

FIG. 9 shows a further way of suppressing the zero order mode. FIG. 9 shows a schematic of the p-n junction laser of FIG. 3 with the addition of an elongated lossy region. Laser 500 comprises semiconductor substrate 501, n-type layer 502, p-type layer 503 which forms p-n junction 504 with the n-type layer, and elongated lossy region 505. Surface 507 is one of two parallel cleavage surfaces which form a resonator. Region 505 is approximately centered about a plane that includes central axis 506 and is perpendicular to the plane of p-n junction 504. In this particular embodiment, region 505 is characterized as being electrically rather than optically lossy. Illustratively, the lossy region 505 is characterized by a large density of nonradiative recombination centers. The resulting carrier concentration profile at the p-n junction is shown in FIG. 10. In order to obtain this carrier concentration profile, the lossy region 505 should include a portion of p-n junction 504. The zero order mode is suppressed because nonradiative recombination dominates radiative recombination within the lossy region. The dominant first order mode is shown in FIG. 11. However, higher modes may introduce nonlinear distortions into the far field pattern.

The concepts illustrated in FIGS. 3–11 are easily extendable to higher order modes. For example, in order to suppress the first order mode it is necessary to introduce an elongated lossy region, extending parallel to the direction of stimulated emission, essentially coincident with at least one maximum of the first order mode.

The principles of this invention apply to a wide variety of semiconductor lasers including for example, broad area contact homojunction devices, stripe geometry homojunction devices, buried heterostructure devices, broad area double heterostructure devices and stripe geometry double heterostructure devices. The scope of the present invention includes isotype lasers in which the p-n junction is separated from the active region by a high bandgap cladding layer of the same conductivity type as the active region. This type of laser exhibits reduced non-radiative recombination current (see Hartman, U.S. Pat. Application Ser. No. 50,637, filed on June 21, 1979 and assigned to the assignee hereof, now U.S. Pat. No. 4,313,125). For lasers in the stripe geometry configuration, the stripe may be delineated in various ways including shallow and deep proton bombardment, and oxygen or other deep trap implantation. The double heterostructure devices may comprise a p-type substrate and a p-n-n sequence of layers or an n-type substrate and an n-p-p sequence of layers. Optical resonators for the above-mentioned lasers may comprise parallel cleavage surfaces, gratings or etched mirrors.

Illustrative embodiments of the invention may be constructed in various materials systems depending on the wavelength desired. For example, the $Al_xGa_{1-x}As$ materials systems may be used to form a laser which operates at wavelengths ranging from 0.66 $\mu$m to 89 $\mu$m and the InGaAsP may be used to form a laser which operates at approximately 1.5 $\mu$m.

The electrically lossy regions may be introduced by various techniques including proton bombardment, oxygen implantation (see Blum, J. M., et al, "Oxygen Implanted Double Heterojunction GaAs/GaAlAs Injection Lasers", IEEE *Journal of Quantum Electronics*, Vol. QE11, No. 7, July 1975, page 413), and chromium implantation. Optically lossy regions may also be formed by proton bombardment. A fabrication technique for forming a double heterostructure stripe geometry laser having an optically lossy region is described later.

In addition, the elongated lossy regions may be segmented in a plurality of tandem sections in a direction parallel to the direction of stimulated emission.

Figure 12:
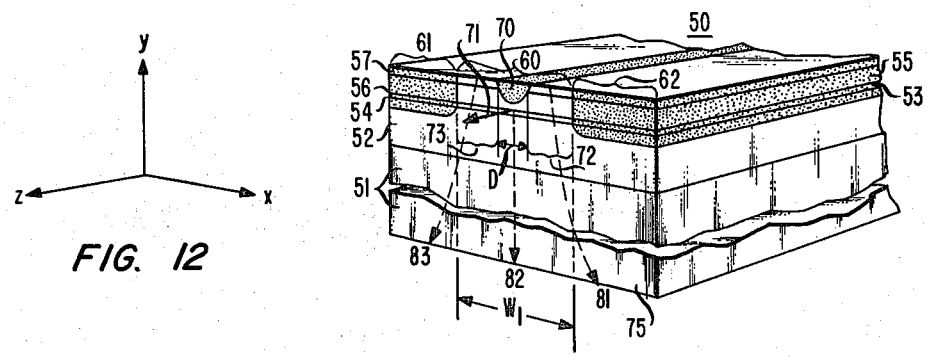
FIG. 12 illustrates a double heterostructure stripe geometry laser in which the first order transverse mode parallel to the p-n junction is stabilized in accordance with an illustrative embodiment of the invention.

FIG. 12 exhibits a laser 50 in accordance with an illustrative embodiment of the invention. Laser 50 is a stripe geometry double heterostructure which is designed to operate stably in the first order transverse mode parallel to the p-n junction. The numerical parameters stated in connection with this embodiment of the invention are illustrative only and are not intended as limitations on the scope of the invention.

Laser 50 comprises an n-type GaAs substrate 51 and the following contiguous epitaxial layers grown thereon:

a wide bandgap, n-type $Al_xGa_{1-x}As$ cladding layer 52 approximately 2.0 $\mu$m thick with a carrier concentration on the order of $8 \times 10^{17}/cm^3$;

a narrower bandgap p-type GaAs active layer 53 approximately 0.15 $\mu$m thick with a carrier concentration on the order of $3 \times 10^{17}/cm^3$ forming a p-n heterojunction 54 with wide bandgap n-type layer 52;

a wide bandgap p-type $Al_xGa_{1-x}As$ cladding layer 55 approximately 1.5 $\mu$m thick with a carrier concentration of about $8 \times 10^{17}/cm^3$ forming a p-p heterojunction 56 with the p-type GaAs layer 53, and a p+-type GaAs capping layer 57.

A current flow channel 60 of width $W_1$ is delineated between proton bombarded zones 61 and 62. Zones 61 and 62 are bombarded with a dose of about $3 \times 10^{15}$ protons/cm$^2$ at an energy of 300 Kev in order to increase their electrical resistivity, thereby constraining the current flow through layer 53 to the narrow channel 60 formed between regions 61 and 62. Thus, the stripe geometry active region is that portion of layer 53 bounded by regions 61 and 62. Current flow channel 60 forms a relatively narrow portion of the current flow path of the laser shown in FIG. 12. The current flow path of this laser is symbolically indicated by arrows 81, 82, 83.

In order to suppress the zero-order transverse mode in a direction parallel to p-n junction 54, proton bombardment may also be used to introduce an optically lossy region 70 of width D. Region 70 is located in the current flow channel between proton bombarded zones 61 and 62 and is centered approximately about a plane that is perpendicular to the plane of the layers and includes central axis 71. Typically, $W_1$ is 15 μm and D is 5 μm. Forward biasing the p-n junction results in the generation of stimulated emission between cleavage surface 75 and a parallel cleavage surface (not shown) which together form an optical resonator.

The symmetric zero order mode which has a maximum along the central axis of the stripe (see FIG. 2) is substantially suppressed by the lossy region. The first order antisymmetric mode (see FIG. 13) is substantially unaffected by the lossy region because it has a minimum along the central axis. Laser 50 of FIG. 12 operates linearly in the first order transverse mode parallel to the p-n junction. Nonlinearities of the type exhibited by the laser of FIG. 1, resulting from a mixing of the zero and first order transverse modes, are substantially mitigated by the laser of FIG. 12.

Figure 13:
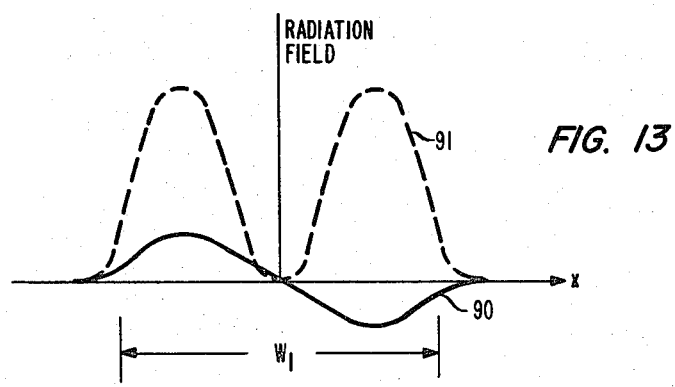
FIG. 13 shows the far field radiation pattern of the laser exhibited in FIG. 12.

FIG. 13 shows the far field radiation pattern of the laser exhibited in FIG. 12. The abscissa of the graph in FIG. 13 is in the X direction. The solid curve 90 is the antisymmetric first order transverse mode of the electric field. The dashed curve 91 is the far field intensity pattern of the first order mode and is proportional to the square of the electric field.

The threshold current for the laser shown in FIG. 12 is approximately the same current which would be observed if lossy region 70 did not exist. This current is much less than the threshold current for two lasers of widths $(W_1-D)/2$ operating in parallel, each in the zero order transverse mode parallel to the p-n junction.

A typical fabrication procedure for the laser shown in FIG. 12 is as follows. The GaAs—$Al_xGa_{1-x}As$ double heterostructure layers 52, 53, 55, and 57 are grown on a GaAs substrate by a suitable epitaxy technique such as liquid phase epitaxy or molecular beam epitaxy. A shallow zinc diffusion is performed to facilitate the formation of an ohmic contact to the uppermost p+-type layer 57. Thin layers of titanium and platinum (not shown) are then deposited on the p+-type layer. The semiconductor substrate 51 is lapped to 3-4 mils and a metal layer (e.g., Sn-Pd-Au) is deposited on the lower surface of the substrate.

Illustratively, regions 72 and 73 are masked by a pair of parallel tungsten wires in contact with the wafer and separated by an area coextensive with region 70 (see D'Asaro et al, supra). The area between the parallel wires is masked by a gold film of predetermined thickness. The thickness of the gold film determines the depth of the lossy region following proton bombardment (see, for example, Andersen, H. H., and Ziegler, J. F., "Hydrogen Stopping Powers and Ranges in All Elements," Vol. 3, Pergamon Press, N.Y., 1977). The previously deposited titanium and platinum layers do not appreciably attenuate the proton penetration. The wafer is bombarded with a dose of about $3 \times 10^{15}$ protons/cm² at 300 Kev. These protons penetrate approximately 3 μm into the unmasked regions of the wafer.

Alternatively, the masking prior to proton bombardment can be accomplished by forming a gold layer of nonuniform thickness on the wafer. The gold layer is thickest where strong attenuation is desired and thinnest where little or no attenuation is desired.

Following proton bombardment, the wafer is cleaved and mounted on a heat sink to enable continuous wave operation at room temperature.

The type of laser described here could find application in a class of optical systems in which the output of the laser is coupled into two optical fibers, one lobe of the first order mode into each fiber. The optical intensities and phases in these fibers would be precisely related to one another. This would be useful wherever two identical beams are required, but, where beam splitters, etc. are awkward. An example of such an instrument is an optical gyroscope. Furthermore, it is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

We claim:

1. In a semiconductor junction laser, a semiconductor body comprising:
    at least two contiguous layers forming a planar p-n junction;
    means forming a current flow path overlapping at least a portion of said p-n junction;
    an active region within said current flow path for generating stimulated radiation when said p-n junction is forward biased; and
    an elongated lossy region located in said current flow path and positioned for causing said laser to operate in a particular higher order transverse mode in a direction parallel to said p-n junction.

2. The laser of claim 1 wherein said lossy region is an optically lossy region.

3. The laser of claim 1 wherein said lossy region is an electrically lossy region that overlaps a portion of said active region.

4. The laser of claim 1 wherein said elongated lossy region is located at approximately the center of said current flow path and is effective to suppress the zero order transverse mode in a direction parallel to the p-n junction.

5. In a semiconductor junction laser, a semiconductor body comprising:
    a pair of parallel planar heterojunctions defining an optical waveguide therebetween,
    at least one of said heterojunctions being a p-n junction;
    means forming a current flow path overlapping at least a portion of said p-n junction, at least a portion of said current flow path being formed by a relatively narrow current flow channel;
    a stripe geometry active region located within said waveguide and within said current flow path for generating stimulated radiation when said p-n junction is forward biased; and
    an elongated lossy region located within said current flow path and positioned for causing said laser to operate in a particular higher order transverse mode in a direction parallel to said p-n junction.

6. The laser of claim 5 wherein said current flow channel overlaps said p-n junction, said stripe geometry active region is within said channel, and said lossy region is within said channel.

7. The laser of claim 6 wherein said elongated lossy region is located at approximately the center of said current flow channel in order to suppress the zero order transverse mode in a direction parallel to said p-n junction, thereby allowing substantially linear operation in the first order transverse mode parallel to said p-n junction.

8. The laser of claim 6 wherein the semiconductor body comprises $Al_xGa_{1-x}As$, $0 \leq X < 1$.

9. The laser of claim 8 wherein the lossy region is a proton bombarded region.

10. In a semiconductor junction laser a semiconductor body comprising:
- an n-type GaAs body and a plurality of epitaxial layers grown thereon in the following order,
- a layer of n-type $Al_xGa_{1-x}As$,
- a layer of p-type $Al_yGa_{1-y}As$ (y<x) forming a p-n heterojunction with said n-type $Al_xGa_{1-x}As$ layer,
- a layer of p-type $Al_zGa_{1-z}As$ (z>y),
- a layer of p+-type GaAs;
- a pair of spaced parallel cleavage surfaces perpendicular to the plane of said layers forming an optical resonator, p1 means defining a current flow channel extending between said cleavage surfaces comprising a pair of spaced proton bombarded zones extending between said cleavage surfaces and from the top of said p+-type GaAs layer into said n-type $Al_xGa_{1-x}As$ layer, and
- a stripe geometry active region comprising the portion of said p-type $Al_yGa_{1-y}As$ layer situated between said proton bombarded zones capable of generating stimulated radiation in a direction parallel to said stripe region when a forward bias is applied to said p-n junction CHARACTERIZED BY:
- an elongated lossy region extending parallel to said stripe geometry region and centered approximately midway between said proton bombarded zones, effective to suppress the zero order transverse mode parallel to the p-n junction, thereby allowing substantially linear operation in the first order transverse mode parallel to the p-n junction.

11. In a semiconductor junction laser, a semiconductor body comprising:
- at least two contiguous layers forming a p-n junction;
- an active region proximate said junction for generating stimulated radiation when said p-n junction is forward biased; and
- an elongated lossy region located within said body and positioned for causing said laser to operate in a particular higher order transverse mode in a direction parallel to said p-n junction.

* * * * *